United States Patent
Cho et al.

(10) Patent No.: US 7,283,387 B2
(45) Date of Patent: Oct. 16, 2007

(54) PHASE CHANGE RANDOM ACCESS MEMORY DEVICE HAVING VARIABLE DRIVE VOLTAGE CIRCUIT

(75) Inventors: Woo-yeong Cho, Suwon-si (KR);
Du-eung Kim, Yongin-si (KR);
Kwang-jin Lee, Hwaseong-si (KR);
Choong-keun Kwak, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/316,256

(22) Filed: Dec. 23, 2005

(65) Prior Publication Data

US 2007/0058425 A1    Mar. 15, 2007

(30) Foreign Application Priority Data

Sep. 8, 2005    (KR)    ...................... 10-2005-0083581

(51) Int. Cl.
*G11C 11/00*    (2006.01)
*G11C 5/14*    (2006.01)

(52) U.S. Cl. .................. 365/163; 365/148; 365/189.09; 365/226

(58) Field of Classification Search .................. 365/163
See application file for complete search history.

(56) References Cited

U.S. PATENT DOCUMENTS

| 6,522,594 | B1 * | 2/2003 | Scheuerlein | ................. 365/206 |
| 6,567,296 | B1 | 5/2003 | Casagrande et al. | |
| 7,092,277 | B2 * | 8/2006 | Bedeschi et al. | ........... 365/148 |
| 7,099,180 | B1 * | 8/2006 | Dodge et al. | ................ 365/148 |
| 7,154,774 | B2 * | 12/2006 | Bedeschi et al. | ........... 365/163 |
| 2002/0136047 | A1 | 9/2002 | Scheuerlein | |
| 2003/0123284 | A1 | 7/2003 | Lowrey et al. | |
| 2003/0198118 | A1 | 10/2003 | Lowery | |
| 2004/0027908 | A1 | 2/2004 | Ooishi et al. | |
| 2004/0051094 | A1 | 3/2004 | Ooishi | |
| 2005/0030814 | A1 | 2/2005 | Oh et al. | |
| 2006/0221734 | A1 * | 10/2006 | Bedeschi et al. | ........... 365/201 |

FOREIGN PATENT DOCUMENTS

| JP | 2004-079002 | 3/2004 |
| JP | 2004-110867 | 4/2004 |
| KR | 10-2004-0074088 | 8/2004 |

* cited by examiner

*Primary Examiner*—Son L. Mai
(74) *Attorney, Agent, or Firm*—Volentine & Whitt, PLLC

(57) ABSTRACT

A phase change memory device includes a memory array including a plurality of phase change memory cells, each phase change memory cell including a phase change material and a diode, a plurality of column selection transistors connecting bit lines connected to the phase change memory cells to corresponding data lines, and a control node connecting the data lines to a sense amplifier unit. In a write operation mode, control voltages obtained by boosting a first voltage are respectively applied to the control node and gates of the column selection transistors, and a ground voltage is applied to a word line of a selected one of the phase change memory cells. In a standby mode, word lines and bit lines connected to the phase change memory cells of the memory array are maintained at the same voltage. According to the phase change memory device and a driving method thereof, a sufficient write voltage is supplied to a write driver, a column decoder and a row decoder in the write operation mode, and a voltage lower is applied to the write driver, the column decoder and the row decoder in the read operation mode and the standby mode, thereby reducing current consumption and enhancing operational reliability.

18 Claims, 7 Drawing Sheets

US 7,283,387 B2

PHASE CHANGE RANDOM ACCESS MEMORY DEVICE HAVING VARIABLE DRIVE VOLTAGE CIRCUIT

BACKGROUND OF THE INVENTION

1. Field of the Invention

The present invention generally relates to semiconductor memory devices, and more particularly, the present invention relates to a phase change memory devices.

A claim of priority is made to Korean Patent Application No. 10-2005-0083581, filed on Sep. 8, 2005, in the Korean Intellectual Property Office, the disclosure of which is incorporated herein in its entirety by reference.

2. Description of the Related Art

A phase-change random access memory (PRAM), also known as an Ovonic Unified Memory (OUM), includes a phase-change material such as a chalcogenide alloy which is responsive to energy (e.g., thermal energy) so as to be stably transformed between crystalline and amorphous states. Such a PRAM is disclosed, for example, in U.S. Pat. Nos. 6,487,113 and 6,480,438.

The phase-change material of the PRAM exhibits a relatively low resistance in its crystalline state, and a relatively high resistance in its amorphous state. In conventional nomenclature, the low-resistance crystalline state is referred to as a 'set' state and is designated logic "0", while the high-resistance amorphous state is referred to as a 'reset' state and is designated logic "1".

The terms "crystalline" and "amorphous" are relative terms in the context of phase-change materials. That is, when a phase-change memory cell is said to be in its crystalline state, one skilled in the art will understand that the phase-change material of the cell has a more well-ordered crystalline structure when compared to its amorphous state. A phase-change memory cell in its crystalline state need not be fully crystalline, and a phase-change memory cell in its amorphous state need not be fully amorphous.

Generally, the phase-change material of a PRAM is reset to an amorphous state by joule heating of the material in excess of its melting point temperature for a relatively short period of time. On the other hand, the phase-change material is set to a crystalline state by heating the material below its melting point temperature for a longer period of time. In each case, the material is allowed to cool to its original temperature after the heat treatment. Generally, however, the cooling occurs much more rapidly when the phase-change material is reset to its amorphous state.

The speed and stability of the phase-change characteristics of the phase-change material are critical to the performance characteristics of the PRAM. As suggested above, chalcogenide alloys have been found to have suitable phase-change characteristics, and in particular, a compound including germanium (Ge), antimony (Sb) and tellurium (Te) (e.g., $Ge_2Sb_2Te_5$ or GST) exhibits a stable and high speed transformation between amorphous and crystalline states.

FIGS. 1A and 1B illustrate a memory cell 10 in a 'set' state and in a 'reset' state, respectively. In this example, the memory cell 10 includes a phase-change resistive element 11 and a diode D connected in series between a bit line BL and a word line WL. It should be noted that FIGS. 1A and 1B are general schematic views only, that the configuration of the phase-change resistive element 11 is presented as an example only, and that other configurations and connections with respect to the phase-change resistive element 11 are possible. As an example of one variation, the phase-change resistive element 11 may instead be connected in series with a transistor between the bit line BL and a reference potential, with the gate of the transistor connected to the word line WL.

In each of FIGS. 1A and 1B, the phase-change resistive element 11 includes a top electrode 12 formed on a phase-change material 14. In this example, the top electrode 12 is electrically connected to a bit line BL of a PRAM memory array (not shown). A conductive bottom electrode contact (BEC) 16 is formed between the phase-change material 14 and a conductive bottom electrode 18. The diode D is electrically connected between the bottom electrode 18 and the word line WL.

In FIG. 1A, the phase-change material 14 is illustrated as being in its crystalline state. As described previously, this means that the memory cell 10 is in a low-resistance 'set' state or logic 0 state. In FIG. 1B, a portion of the phase-change material 14 is illustrated as being amorphous. Again, this means that the memory cell 10 is in a high-resistance 'reset' state or logic 1 state.

The set and reset states of the memory cell 10 of FIGS. 1A and 1B are established by controlling the magnitude and duration of current flow through the BEC 16. That is, the phase-change resistive element 11 is activated (or accessed) by operation of diode D which is responsive to a voltage of the word line WL. When activated, the memory cell 10 is programmed according to the voltage of the bit line BL. The bit line BL voltage is controlled to establish a programming current which causes the BEC 16 to act as a resistive heater which selectively programs the phase-change material 14 in its 'set' and 'reset' states.

FIG. 2 is a circuit diagram of a memory array 200 including the diode-type phase change memory cells of FIGS. 1A and 1B.

Referring to FIG. 2, each phase change memory cell of the memory array 200 includes a phase change element 11 and a diode D connected in series between a bit line BL and a word line WL. In order to select a memory cell, a high level voltage is applied to the corresponding selected bit line BL and a low level voltage is applied to the corresponding selected word line WL. The non-selected bit lines BL receive a low level voltage, and the remaining non-selected word lines WL receive a high level voltage.

FIG. 3 is a circuit diagram of a conventional phase change memory device 300.

Referring to FIG. 3, the phase change memory device 300 includes a memory array 310, a memory array controller 320, a write driver 320, a write driver WD, a column decoder YD, a row decoder XD, and a sense amplifier SAU.

The memory array 310 includes a plurality of memory cells 10, each comprised of a phase change element GST and a diode D connected between a bit line BL and a word line WL.

Each bit line BL is selectively connected to a data line DL by a respective column selection transistors CSTR, and the data line DL is connected to a sense node NA. The column selection transistors CSTR operate under control of the column decoder YD, which in turn is responsive to a column address signal YADD.

The write driver WD writes data to the memory cells 10 in a write operation mode. An exemplary structure of the write driver WD is disclosed in Korean Patent Application No. 2004-45849, and a detailed description thereof is omitted for the sake of brevity.

The row decoder XD controls a voltage at node NC of each word line WL so as to select a word line WL of a selected memory cell 10 to or from which data will be written or read in response to a row address XADD. As mentioned above, a word line WL is selected by application of a low level voltage thereto. The non-selected word lines WL receive a high level voltage.

The column decoder YD controls a voltage of a node NB to which a gate of a column selection transistor CSTR is connected, thus connecting or disconnecting the memory cell 10 to or from the corresponding node NA.

The sense amplifier SAU senses the voltage of the node NA to measure a data value when a data read operation is performed. The sense amplifier SAU includes a sense amplifier circuit S/A, a bias transistor BTR connected between an input terminal of the sense amplifier circuit S/A and a sense amplifier supply voltage VSA, and a clamp transistor PTR connected between the node NA and the input terminal of the sense amplifier circuit S/A. A reference voltage VREF is applied to the other input terminal of the sense amplifier circuit S/A.

The sense amplifier supply voltage VSA may be equal to a supply voltage VCC for driving the write driver WD, the column decoder YD, and the row decoder XD, or may be different from the supply voltage VCC.

The bias transistor BTR is turned on by a bias voltage VBIAS in a standby mode to maintain the node NA at the sense amplifier supply voltage VSA. The clamp transistor PTR is turned on by a clamp voltage VCLAMP in a read operation mode to maintain the node NA at a clamp voltage VCLAMP.

In order to apply the supply voltage VCC to the bit lines of selected memory cells 10, the memory array controller 320 includes transistors TR2 which are turned on in response to a signal CE, and transistors TR1 which are turned on in response to a signal nPulse before a data read operation or a data write operation to ground the bit lines.

As shown in FIG. 3, the write driver WD, the column decoder YD, and the row decoder XD are driven by the supply voltage VCC.

However, in a write operation mode, the phase change memory device 300 must maintain high level voltages at the nodes NA, NB, and NC of FIG. 3 in order to ensure sufficient current to reliably induce a phase transformation of the phase change material each memory cell. On the other hand, it is necessary generate a relatively low drive voltage to reliably execute in a read operation mode, and to generate a low level voltage in a standby mode to minimize power consumption caused by leakage current in the standby mode. These differing voltage requirements can result in complicated circuit schemes and manufacturing processes.

SUMMARY OF THE INVENTION

According to an aspect of the present invention, a phase change memory device is provided which includes a memory array including a plurality of phase change memory cells, a plurality of bit lines, and a plurality of word lines. Each phase change memory cell includes a phase change element and a diode connected in series between a bit line and a word line. The phase change memory device further includes a control node, a plurality of column selection transistors which selectively connect respective bit lines to the data line, and a least one boosting circuit which receives a first voltage and outputs at least one control voltage which is greater than the first voltage. In a write operation mode, the phase change memory device is adapted to apply at least one control voltage from the at least one boosting circuit to the control node and respective gates of the column selection transistors. In a standby mode, the phase change memory device is adapted to maintain the word lines and the bit lines at a same voltage.

According to another aspect of the present invention, a phase change memory device is provided which includes a memory array including a plurality of phase change memory cells, a plurality of bit lines, and a plurality of word lines. Each of the phase change memory cell includes a phase change element and a diode connected in series between a bit line and a word line. The phase change memory device further includes a write driver which writes data to one of the phase change memory cells of the memory array, a column decoder which selects a bit line of the phase change memory cell to which the data is written, a row decoder which selects a word line of the phase change memory cell to which the data is written, and a plurality of separate voltage generators which respectively supply drive voltages to the write driver, the column decoder, and the row decoder. The memory device is adapted in a standby mode to maintain the word lines and the bits lines at the same voltage.

BRIEF DESCRIPTION OF THE DRAWINGS

The above and other aspects and advantages of the present invention will become readily apparent from the detailed description that follows, with reference to the accompanying drawings, in which.

DETAILED DESCRIPTION OF PREFERRED EMBODIMENTS

Figure 1A:
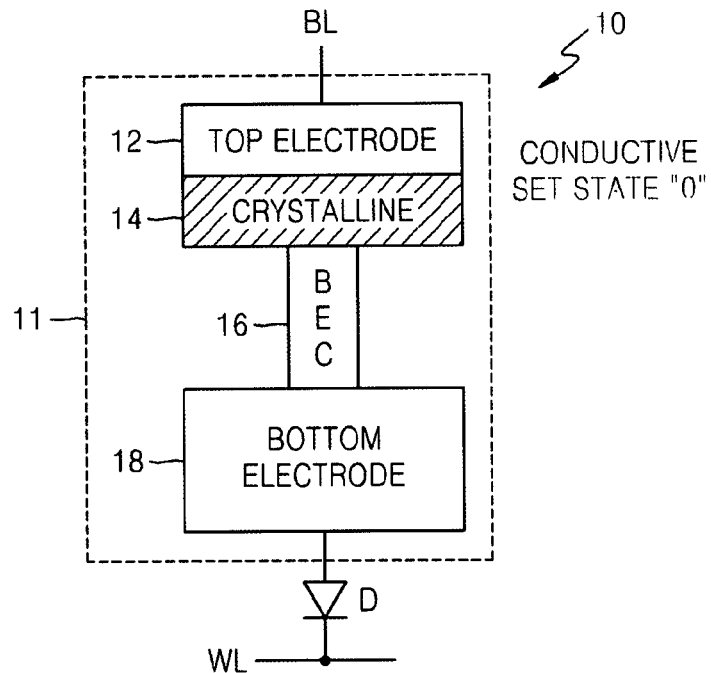
FIGS. 1A and 1B are respectively schematic views of a phase change memory cell with a phase change material having a crystalline state and an amorphous state.
Figure 1B:
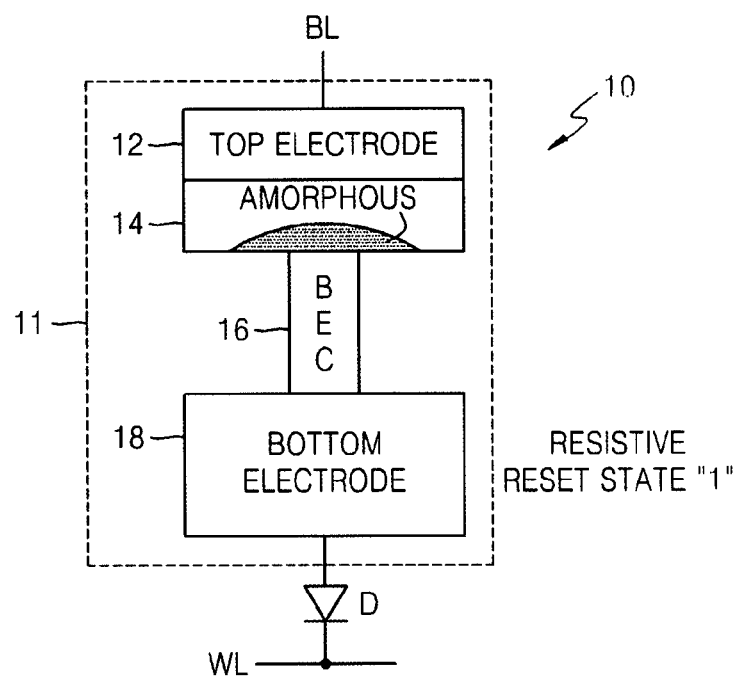
Figure 2:
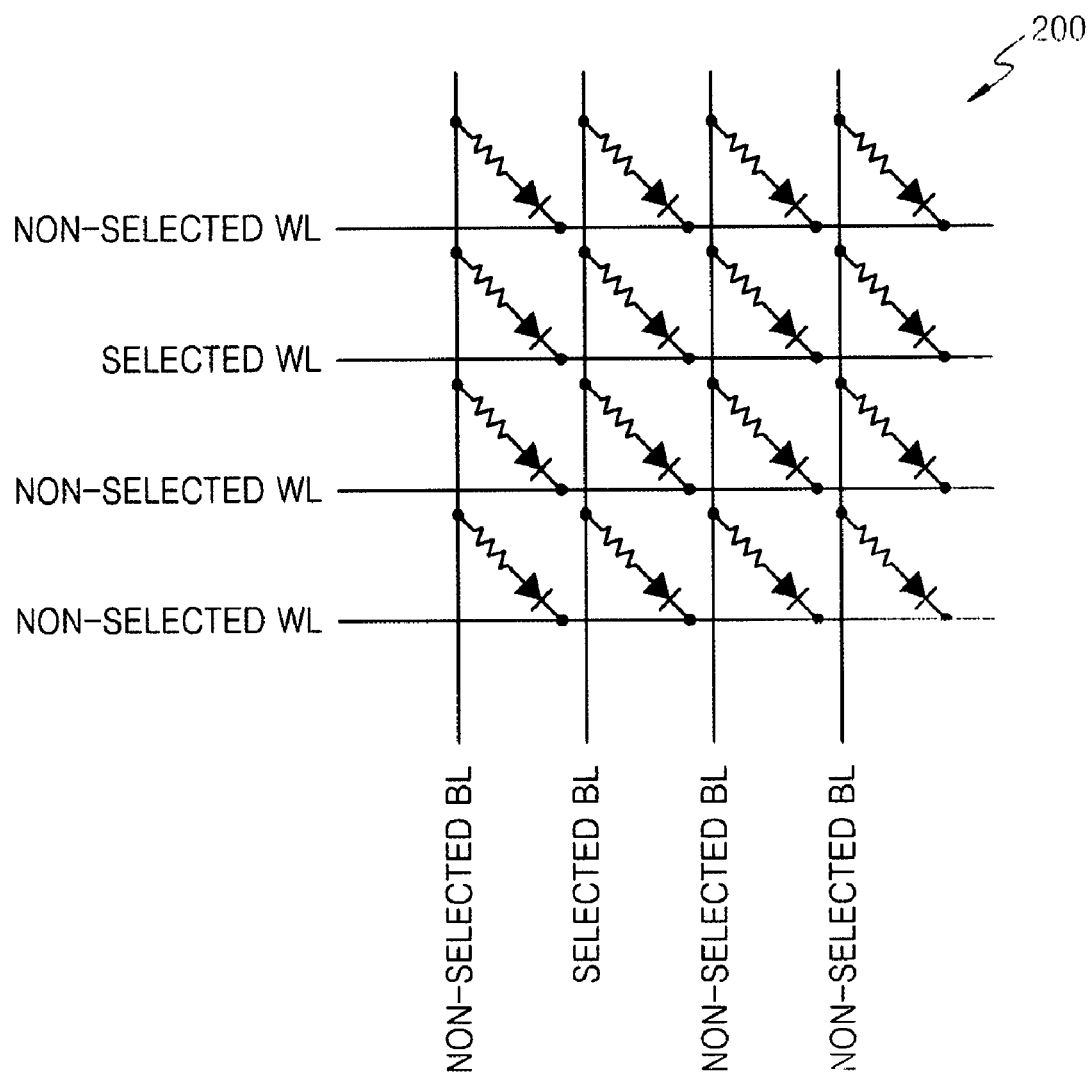
FIG. 2 is a circuit diagram of a memory array including diode-type phase change memory cells.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements, and thus their descriptions will not be repeated.

Figure 4:
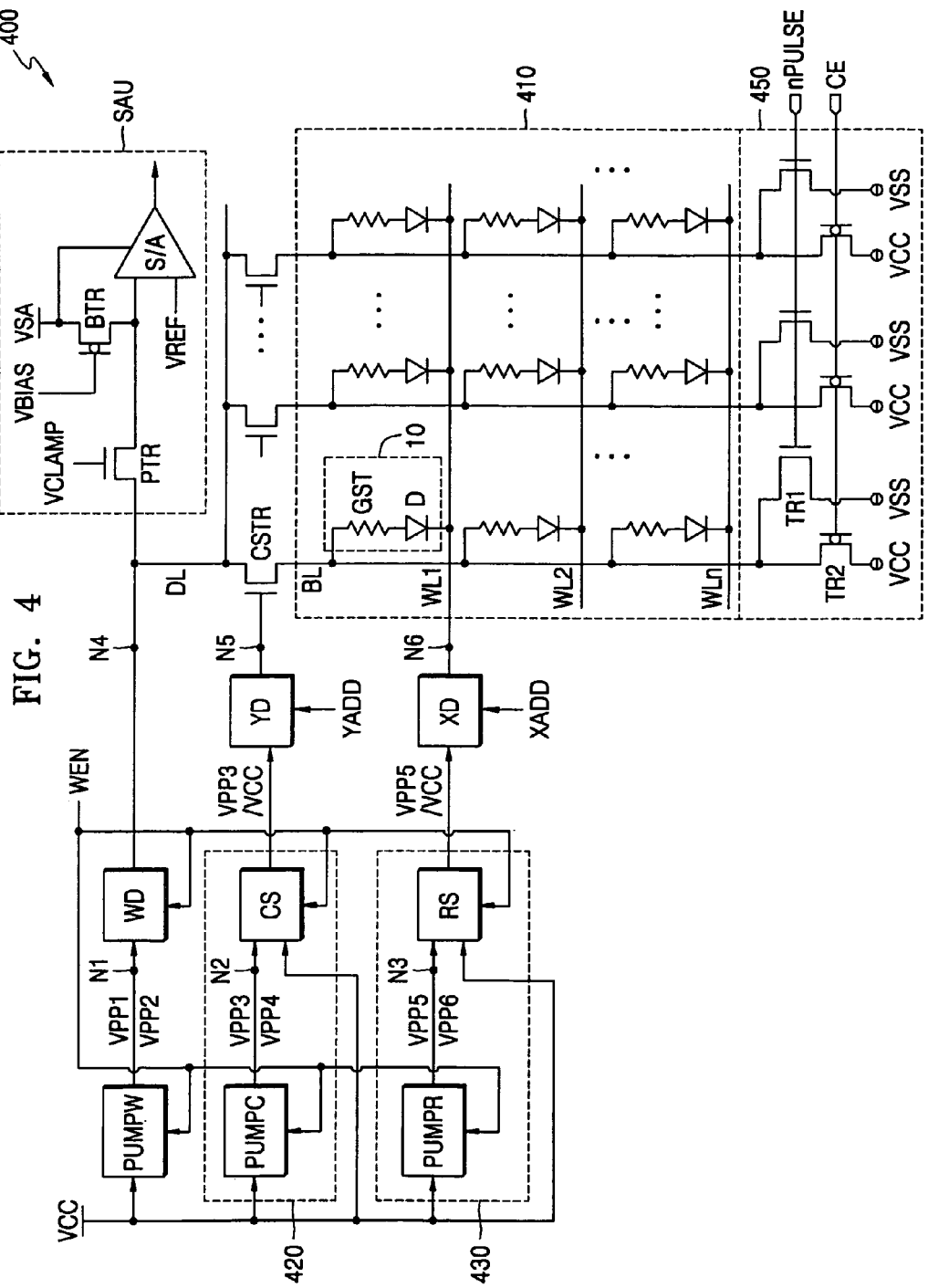
FIG. 4 is a circuit diagram of a phase change memory device according to an embodiment of the present invention.

Referring to FIG. 4, the phase change memory device 400 includes a memory array 410, a memory array controller 450, a plurality of column select transistors CSTR, a sense amplifier SAU, a column decoder YD, a row decoder XD, a write driver WD, a column drive selector CS, a row drive selector RS, and boosting circuits PUMPW, PUMPC and PUMPR. The column boosting circuit PUMPC and the column selector CS constitute a column boosting controller 420, and the row boosting circuit PUMPR and the row selector RS constitute a row boosting controller 430.

The memory array 410 includes a plurality of memory cells 10, each comprised of a phase change material GST and a diode D connected between a bit line BL and a word line WL. The phase change material GST of the phase change memory cells 10 included in the memory array 410 may, for example, include germanium (Ge), antimony (Sb), and tellurium (Te).

Each bit line BL is selectively connected to a data line DL by a respective column selection transistors CSTR, and the data line DL is connected to a sense node NA. The column selection transistors CSTR operate under control of the column decoder YD, which in turn is responsive to a column address signal YADD.

The write driver WD writes data to the memory cells 10 in a write operation mode.

The row decoder XD controls a voltage at node N6 of each word line WL so as to select a word line WL of a selected memory cell 10 to or from which data will be written or read in response to a row address XADD.

The column decoder YD controls a voltage of a node N5 to which a gate of a column selection transistor CSTR is connected, thus connecting or disconnecting the memory cell 10 to or from the corresponding control node N4.

The sense amplifier SAU senses the voltage of the control node N4 to measure a data value when a data read operation is performed. The sense amplifier SAU includes a sense amplifier circuit S/A, a bias transistor BTR connected between an input terminal of the sense amplifier circuit S/A and a sense amplifier supply voltage VSA, and a clamp transistor PTR connected between the control node N4 and the input terminal of the sense amplifier circuit S/A. A reference voltage VREF is applied to the other input terminal of the sense amplifier circuit S/A.

The sense amplifier supply voltage VSA may be equal to a supply voltage VCC, or may be different from the supply voltage VCC.

The bias transistor BTR is turned on by a bias voltage VBIAS in a standby mode to maintain the control node N4 at the sense amplifier supply voltage VSA. The clamp transistor PTR is turned on by a clamp voltage VCLAMP in a read operation mode to maintain the control node N4 at a clamp voltage VCLAMP.

In order to apply the supply voltage VCC to the bit lines of selected memory cells 10, the memory array controller 450 includes transistors TR2 which are turned on in response to a signal CE, and transistors TR1 which are turned on in response to a signal nPulse before a data read operation or a data write operation to ground the bit lines.

The boosting circuit PUMPW receives the supply voltage VCC and outputs boosted voltages VPP1 and VPP2. The boosted voltage VPP1 or VPP2 is applied to a drive node N1 of the write driver WD.

The boosting circuit PUMPC receives the supply voltage VCC and outputs boosted voltages VPP3 and VPP4. The boosted voltage VPP3 or VPP4 is applied to a drive node N2 of the column drive selector.

The boosting circuit PUMPR receives the supply voltage VCC and outputs boosted voltages VPP5 and VPP6. The boosted voltage VPP5 or VPP6 is applied to a drive node N3 of the row drive selector.

The word driver WD, the column drive selector CS, the row drive selector RS, and the boost circuits PUMPW, PUMPC and PUMPR are all operatively responsive to a control signal WEN.

Figure 5:
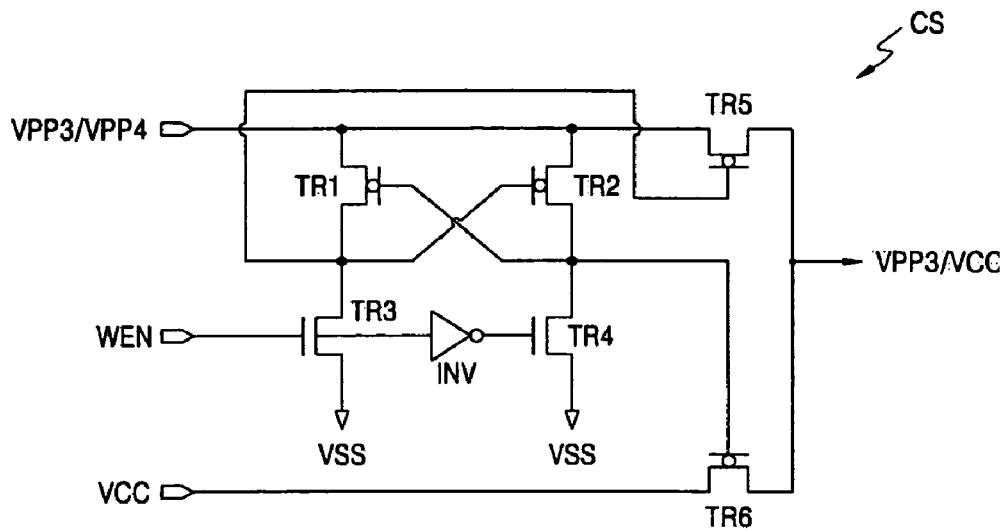
FIG. 5 is a circuit diagram of a column selector illustrated in FIG. 4.

FIG. 5 is a circuit diagram of the column drive selector CS illustrated in FIG. 4. As shown, the column drive selector CS includes and inverter INV, PMOS transistors TR1, TR2, TR5 and TR6, and NMOS transistors TR3 and TR4. As will be explained in more detail later, the boosted voltage VPP3 is output from the column drive selector CS when the control signal WEN is HIGH, while the supply voltage VCC is output from the column drive selector CS when the control enable signal WEN is LOW.

Figure 6:
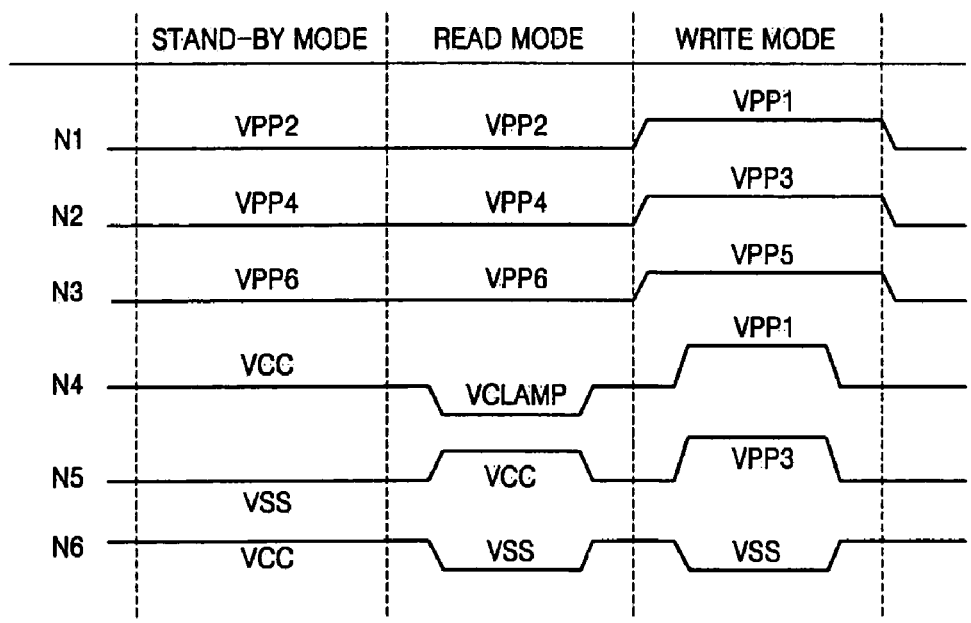
FIG. 6 is a timing diagram of voltages at respective nodes in the phase change memory device illustrated in FIG. 4.

The operation of the phase change memory device 400 of FIGS. 4 and 5 will be described now with additional reference to FIG. 6. FIG. 6 is a timing diagram illustrating of voltages at respective nodes according to operation modes of the phase change memory device 400 illustrated in FIG. 4.

Specifically, the boosting circuits output a high level voltage to generate a sufficient current in a write operation mode, and output an appropriate voltage capable of not causing any problems in the operation of the phase change memory device 400 in a standby mode and a read operation mode.

The write boosting circuit PUMPW boosts the supply voltage VCC and outputs a first control voltage VPP1 in response to a control signal WEN in a write operation mode, and boosts the supply voltage VCC and outputs a second control voltage VPP2 in response to the control signal WEN in a read operation mode or a standby mode. The write driver WD writes data to a selected memory cell 10 when the first control voltage VPP1 is applied thereto.

Figure 3:
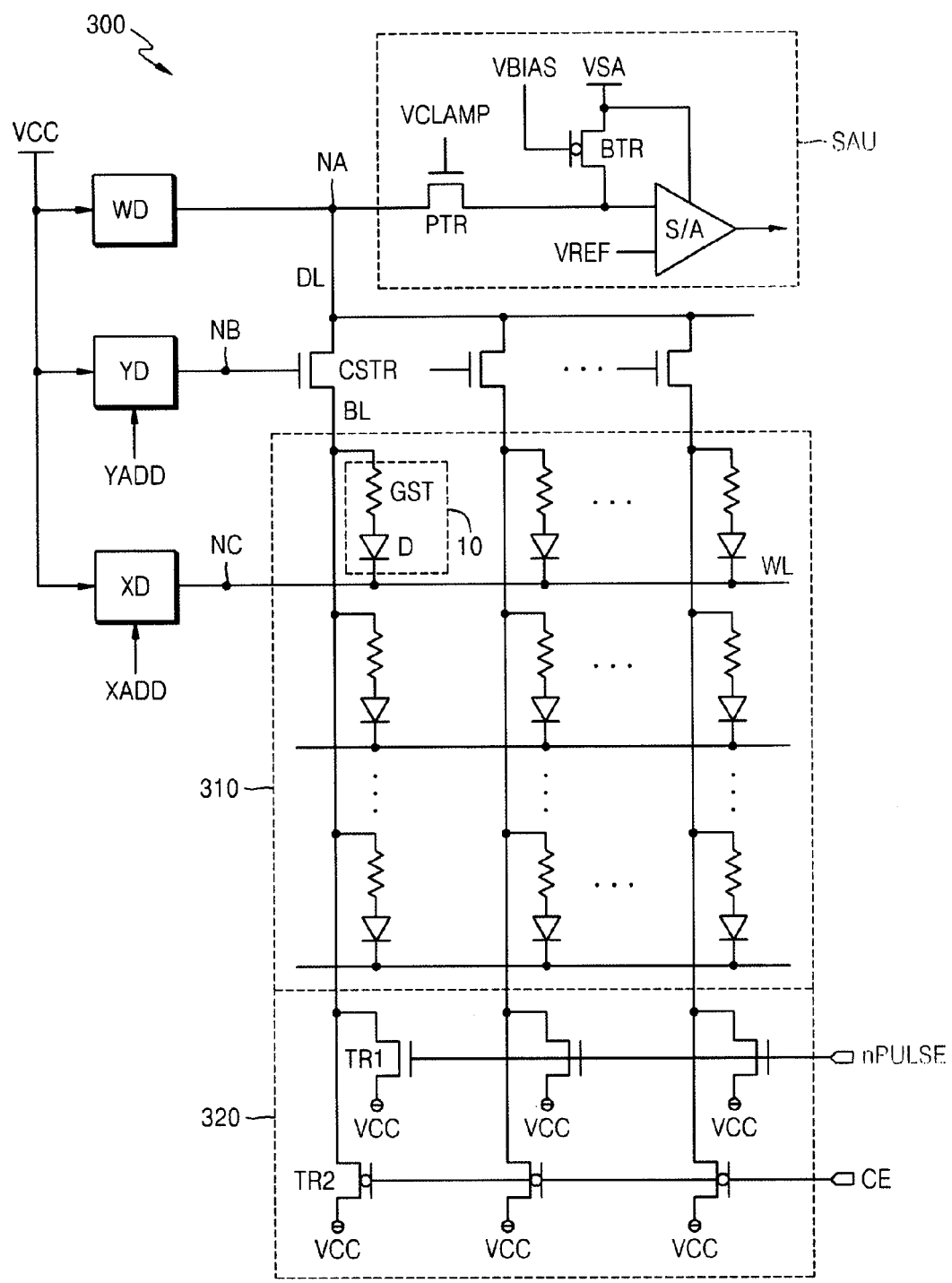
FIG. 3 is a circuit diagram of a conventional phase change memory device.

Here, the control signal WEN is a write enable signal. As seen in FIG. 3, the write driver WD, the column decoder YD and the row decoder XD of the conventional phase change memory device 300 are driven by receiving the supply voltage VCC. However, the phase change memory device 400 according to the embodiment illustrated in FIG. 4 boosts the supply voltage VCC to generate different boosting voltages according to operation modes, and drives the write driver WD, the column decoder YD, and the row decoder XD using the different boosting voltages.

The supply voltage VCC may be an external voltage or a voltage generated by an internal voltage generation circuit (not shown) in response to an external voltage.

Hereinafter, the operation of the phase change memory device 400 in the write operation mode will be described with reference to FIG. 4. In the write operation mode, it is assumed that a memory cell 10 of the memory array 410 is selected in response to a row address signal XADD and a column address signal YADD.

In the write operation mode, the write boosting circuit PUMPW, the column boosting controller 420, and the row boosting controller 430 are all driven so as to drive the write driver WD, the column decoder YD and the row decoder XD.

In the write operation mode, the row boosting controller 430 boosts the supply voltage VCC and outputs a fifth control voltage VPP5 in response to the control signal WEN.

The row boosting controller 430 includes the row boosting circuit PUMPR and the row selector RS. The row boosting circuit PUMPR generates the fifth control voltage VPP5 in response to the control signal WEN in the write operation mode, and boosts the first voltage VCC and outputs a sixth control voltage VPP6 in the read operation mode or the standby operation mode.

The row selector RS outputs one of the fifth control voltage VPP5 and the supply voltage VCC in response to the control signal WEN. The control signal WEN, which is a write enable signal, is activated in the write operation mode.

Thus, the row boosting controller 430 boosts the first voltage VCC and outputs the fifth control voltage VPP5 in response to the activated control signal WEN. The row selector RS selects and outputs the fifth control voltage VPP5 if the control signal WEN is activated, and selects and outputs the first voltage VCC if the control signal WEN is deactivated. The row selector RS has the same structure as the column selector CS and a detailed description thereof will be given later.

The fifth control voltage VPP5 output from the row selector RS drives the row decoder XD, and the row decoder XD grounds a node N6 connected to one of the word lines WL1 through WLn of the memory cell 10 corresponding to an input row address signal XADD. At this time, non-selected word lines WL1 through WLn can be maintained at the fifth control voltage VPP5.

The column boosting controller 420 boosts the supply voltage VCC and outputs a third control voltage VPP3 in response to the control signal WEN in the write operation mode, and outputs the supply voltage VCC in response to the control signal WEN in the read operation mode and the standby mode.

The column decoder YD selects the bit line BL connected to the phase change memory cell 10 corresponding to the column address signal YADD input in response to the third control voltage VPP3 in the write operation mode, selects the bit line BL connected to the memory cell 10 corresponding to the column address signal YADD input in response to the supply voltage VCC in the read operation mode, and does not operate in the standby mode. The column boosting controller 420 includes the column boosting circuit PUMPC and the column selector CS.

The column boosting circuit PUMPC generates the third control voltage VPP3 in response to the control signal WEN in the write operation mode, and boosts the supply voltage VCC and outputs a fourth voltage VPP4 in the read operation mode and the standby mode.

The column selector CS outputs one of the third control voltage VPP3 and the supply voltage VCC in response to the control signal WEN. The column boosting controller 420 boosts the supply voltage VCC and outputs the third control voltage VPP3 in response to the activated control signal WEN. The column selector CS selects the third control voltage VPP3 and applies it to the column decoder YD in response to the activated control signal WEN.

Referring to the column selector CS of FIG. 5, in the write operation mode, if the control signal WEN is activated (high), the transistor TR3 is turned on, and the transistor TR4 is turned off due to the presence of the inverter INV. If the transistor TR3 is turned on, a node between the transistor TR3 and the transistor TR1 is grounded and the transistor TR5 is turned on to output the third control voltage VPP3.

On the other hand, if the control signal WEN is deactivated (low), the transistor TR4 is turned on due to the presence of the inverter INV and a node between the transistor TR4 and the transistor TR2 is grounded. Thus, the transistor TR6 is turned on and the supply voltage VCC is output.

The row selector RS has the same structure as the column selector CS. The column selector CS and the row selector RS each act as a multiplexer selecting one of two voltages received in response to the control signal WEN. The circuit structure of the column selector CS illustrated in FIG. 5 is exemplary, and the invention is not limited to this structure.

The column decoder YD, which is driven by the third control voltage VPP3, applies a voltage to a node N5 to activate a switch for selecting a bit line BL connected to a memory cell 10. Here, the switch is one of the column selection transistors CSTR. The voltage applied to the node N5 depends on the third control voltage VPP3.

The third control voltage VPP3 is sufficiently high to activate the switch for selecting the bit line BL connected to the selected memory cell 10. For example, the third control voltage VPP3 may be about between 3 and 5 V.

The column selection transistor CSTR connecting the memory cell 10 to the control node N4 is turned on by the third control voltage VPP3, more greatly than in the write operation mode of the conventional phase change memory device 300 illustrated in FIG. 3.

In the write operation mode, the write boosting circuit PUMPW boosts the first voltage VCC and outputs the first control voltage VPP1 in response to the control signal WEN, and the write driver WD applies a write voltage to the control node N4 in response to the first control voltage VPP1.

The write voltage depends on the first control voltage VPP1, and the first control voltage VPP1 is sufficiently high to cause a phase change of the memory cell 10. For example, the first control voltage VPP1 may be about between 3 and 5 V.

As such, in the write operation mode, the write boosting circuit PUMPW, the column boosting circuit PUMPC and the row boosting circuit PUMPR respectively output the first control voltage VPP1, the third control voltage VPP3, and the fifth control voltage VPP5 to the corresponding nodes N1, N2 and N3 in response to an activated control signal WEN.

The write driver WD, the column decoder YD and the row decoder XD respectively control the nodes N4, N5 and N6 in response to the first control voltage VPP1, the third control voltage VPP3 and the fifth control voltage VPP5. Accordingly, current loss occurring during a write operation can be reduced.

The voltages of the respective nodes N1 through N6 in the write operation mode are illustrated in FIG. 6.

Figure 7:
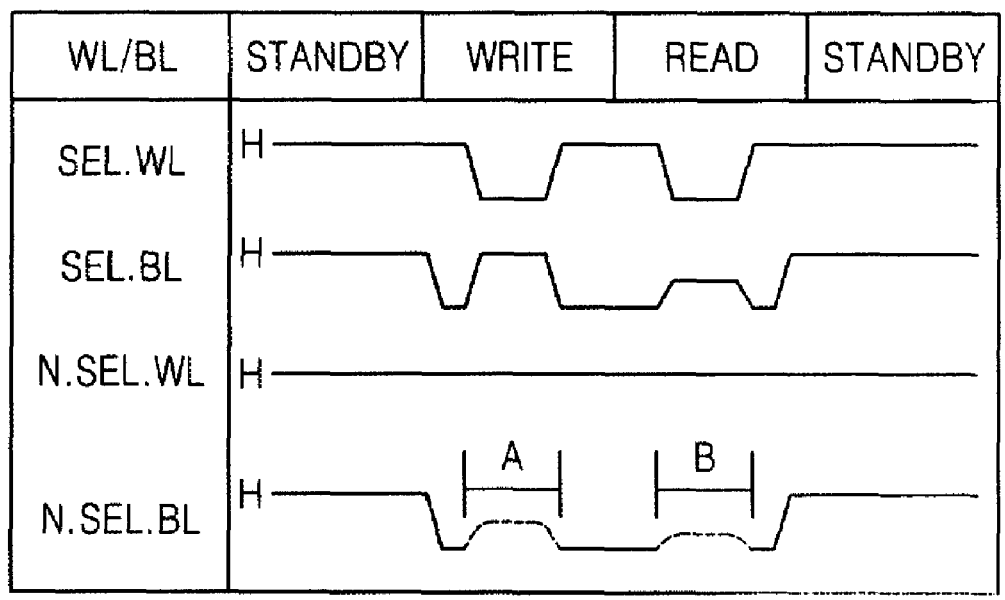
FIG. 7 is a timing diagram of voltages applied to a bit line and a word line when the phase change memory device illustrated in FIG. 4 operates according to an embodiment of the present invention.
Figure 8:
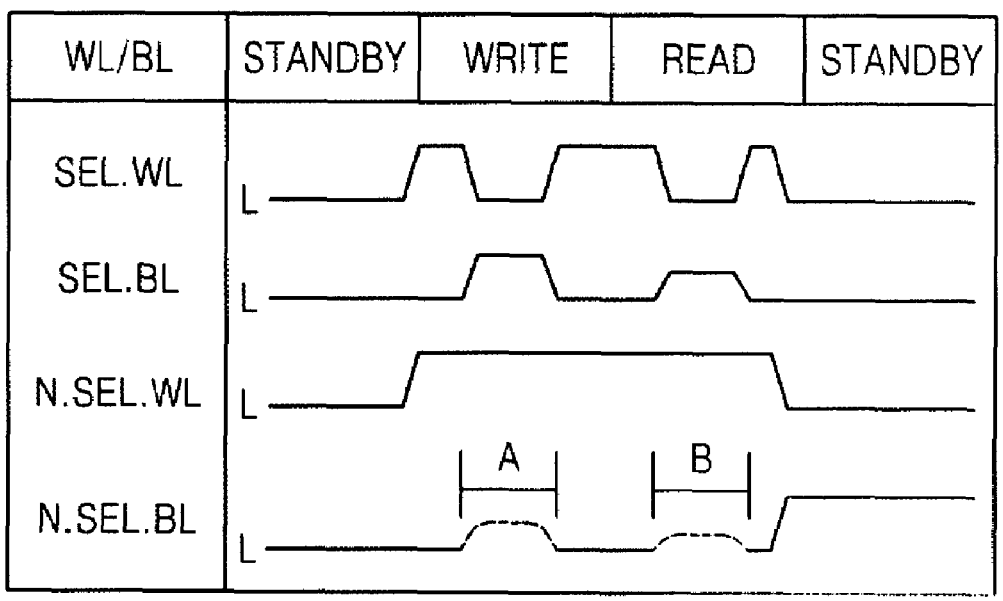
FIG. 8 is a timing diagram of voltages applied to the bit line and the word line when the phase change memory device illustrated in FIG. 4 operates according to another embodiment of the present invention.
Figure 9:
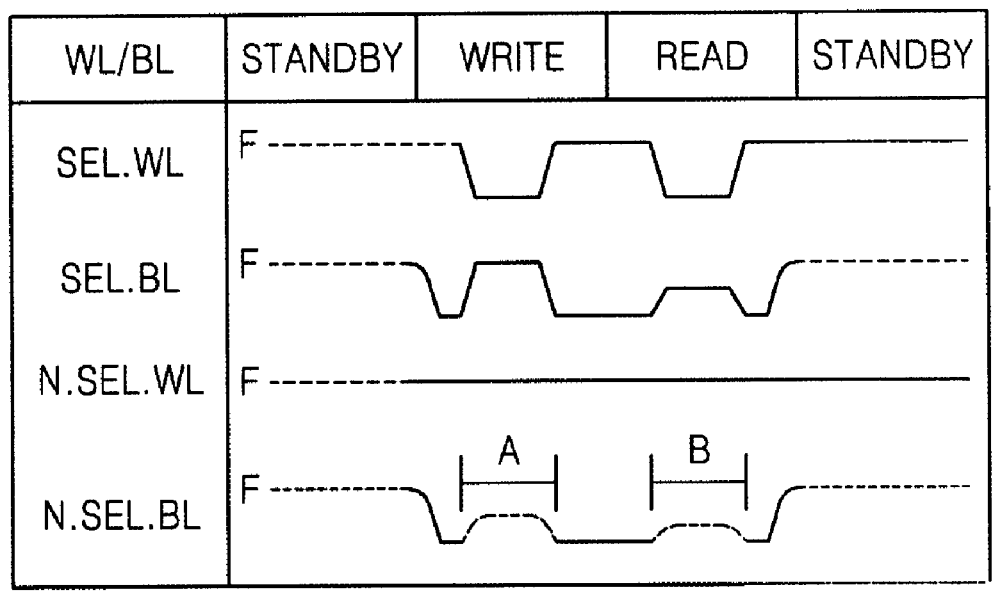
FIG. 9 is a timing diagram of voltages applied to the bit line and the word line when the phase change memory device illustrated in FIG. 4 operates according to another embodiment of the present invention.

FIGS. 7, 8 and 9 are timing diagrams of voltages applied to the bit lines BL and word lines WL when the phase change memory device 100 operates according to respective various embodiments of the present invention.

Referring to FIGS. 7, 8 and 9, the bit lines BL not selected in the write operation mode and the read operation mode are in a floating voltage state. The bit lines BL not selected in the write operation mode or read operation mode are maintained at a low level, and the phase change memory device 400 according to the present embodiment floats the non-selected bit lines BL while the word lines WL selected in the write operation mode and the read operation mode (periods A and B of FIGS. 7, 8 and 9) are activated.

If the non-selected bit lines BL are maintained at the low level, a high level voltage applied to the selected bit lines BL flows to the non-selected bit lines through the adjacent phase change memory cells 10 connected to the selected word lines WL1 through WLn, which can result in a leakage current. By floating the non-selected bit lines, such a problem can be prevented.

Figure 10:
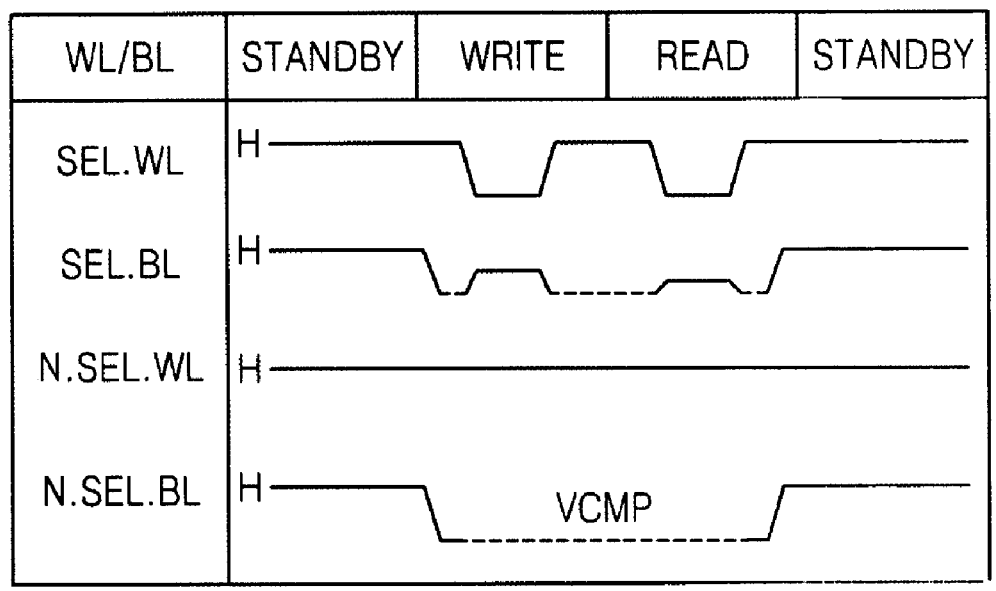
FIG. 10 is a timing diagram of a voltage of a non-selected bit line when the phase change memory device illustrated in FIG. 4 is in a write operation mode or in a read operation mode.

FIG. 10 is a timing diagram of a voltage of an non-selected bit line when the phase change memory device illustrated in FIG. 4 is in a write operation mode or in a read operation mode.

Referring to FIG. 10, the phase change memory device 400 according to the present embodiment causes the voltage of the bit lines BL not selected in a write operation mode and a read operation mode to be a predetermined clamping voltage.

If the bit lines BL not selected in the write operation mode or the read operation mode remain at the low level, the selected bit lines BL to which a high level voltage is applied, the selected word lines WL1 through WLn which are grounded, and non-selected bit lines BL adjacent to the selected bit lines BL form a PNP-type transistor, so that a leakage current flows from the selected bit lines BL to the non-selected bit lines BL.

The phase change memory device 400 maintains the non-selected bit lines BL at the predetermined clamping voltage while the word lines WL1 through WLn selected in the write operation mode and the read operation mode are activated, thereby preventing the leakage current from being generated.

The clamping voltage may be similar to the voltage of the selected bit lines BL so as to prevent the leakage current from being generated.

Hereinafter, the operation of the phase change memory device 400 in the read operation mode and the standby mode will be described with reference to FIGS. 4 and 7 through 10. In the read operation mode, it is assumed that one of the phase change memory cells 10 of the memory array 410 is selected.

In the read operation mode and the standby mode, the control signal WEN is deactivated and the write driver WD does not operate. The write boosting circuit PUMPW outputs the second control voltage VPP2 to the node N1 in response to the deactivated control signal WEN. The second control voltage VPP2 is lower than the first control voltage VPP1 and higher than the supply voltage VCC. For example, the second control voltage VPP2 may be between the supply voltage VCC and 3 V.

The second control voltage VPP2 causes the write boosting circuit PUMPW to generate the first control voltage VPP1 in a short time when the phase change memory device 400 again enters the write operation mode.

That is, although the second control voltage VPP2 is lower than the first control voltage VPP1, even in the read operation and standby modes, because the second control voltage VPP2 is generated by boosting the supply voltage VCC, the first control voltage VPP1 can be generated in a short time during conversion into the write operation mode.

In the read operation mode, the clamp transistor PTR is turned on in response to a clamping voltage VCLAMP so as to maintain the node N4 at the clamping voltage VCLAMP.

The operation of maintaining the node N4 at the clamping voltage VCLAMP in the read operation mode will be appreciated by one of ordinary skill in the art, and therefore a detailed description thereof will be omitted.

In the read operation mode and the standby mode, the column boosting circuit PUMPC outputs to the node N2 a fourth control voltage VPP4 obtained by boosting the supply voltage VCC in response to the deactivated control signal WEN. The fourth control voltage VPP4 is lower than the third control voltage VPP3 and higher than the supply voltage VCC. For example, the fourth control voltage VPP4 may be between the supply voltage VCC and 3 V.

The fourth control voltage VPP4, like the second control voltage VPP2, causes the column boosting circuit PUMPC to generate the third control voltage VPP3 in a short time when the phase change memory device 400 enters the write operation mode.

That is, although the fourth control voltage VPP4 is lower than the third control voltage VPP3, even in the read operation and standby modes, because the fourth control voltage VPP4 is generated by boosting the first voltage VCC, the third control voltage VPP3 can be generated in a short time during conversion into the write operation mode.

In the read operation mode, the column selector CS selects the first voltage VCC and outputs it to the column decoder YD. The column decoder YD controls the voltage of the node N5 connected to the gate of the column selection transistor CSTR in response to the first voltage VCC. Accordingly, the column selection transistor CSTR is turned on and transmits data read from the memory cell 10 to the node N4.

In the write operation mode, the column selection transistor CSTR is turned on in response to the third control voltage VPP3. However, in the read operation mode, the column selection transistor CSTR is turned on in response to the supply voltage VCC.

In the standby mode, the column decoder YD does not operate, but receives the supply voltage VCC from the column selector CS, the column selection transistor CSTR is not selected, and the node N5 is grounded.

In the read operation mode, the row boosting circuit PUMPR outputs to the node N3 the sixth control voltage VPP6 obtained by boosting the supply voltage VCC, to the node N3, in response to the deactivated control signal WEN. The sixth control voltage VPP6 is lower than the fifth control voltage VPP5 and higher than the supply voltage VCC. For example, the sixth control voltage VPP6 may be between the supply voltage VCC and 3 V.

The sixth control voltage VPP6, like the second control voltage VPP2, causes the row boosting circuit PUMPR to generate the fifth control voltage VPP5 in a short time when the phase change memory device 400 enters the write operation mode.

That is, although the sixth control voltage VPP6 is lower than the fifth control voltage VPP5 even in the read operation and standby modes, because the sixth control voltage VPP6 is generated by boosting the supply voltage VCC, the fifth voltage VPP5 can be generated in a short time when entering the write operation mode.

In the read operation mode, the row selector RS selects the supply voltage VCC and outputs it to the row decoder XD. The row decoder XD grounds the node N6 connected to the word line WL1 of the memory cell 10, in response to the supply voltage VCC.

The phase change memory device 400 according to the present embodiment maintains the voltages of the word lines WL1 through WLn and bit lines BL connected to the phase change memory cells 10 of the memory array 410 at the same level in the standby mode, thereby preventing a leakage current from being generated.

In order to maintain the voltages of the word lines WL1 through WLn and bit lines BL connected to the phase change memory cells at the same level in the standby mode, it is possible to maintain the word lines WL1 through WLn and bit lines BL at the supply voltage VCC (see FIG. 7), to ground the word lines WL1 through WLn and bit lines BL (see FIG. 8), or to float the word lines WL1 through WLn and bit lines BL (see FIG. 9).

The write boosting circuit PUMPW, the column boosting circuit PUMC, and the row boosting circuit PUMPR, which generate different control voltages according to operation modes in response to the supply voltage VCC, may have a well-known differential amplifier boosting circuit structure. The structures and operations of the boosting circuits can be appreciated by one of ordinary skill in the art, and therefore detailed descriptions thereof will be omitted.

Also, the structures and operations of the column decoder YD and the row decoder XD can be appreciated by one of ordinary skill in the art, and therefore detailed descriptions thereof will be omitted. The above-mentioned values of the first through sixth control voltages VPP1 through VPP6 are an example for operating the phase change memory device 400, and the invention is not limited to the values described herein.

In the phase change memory device 400 according to the present embodiment, the second, fourth and sixth control voltages VPP2, VPP4 and VPP6 are greater than the supply voltage VCC. This is because second, fourth and sixth control voltages VPP2, VPP4 and VPP6 are to be respectively boosted to the first, third and fifth control voltages VPP1, VPP3 and VPP5 in a short time when the phase change memory device 400 enters the write operation mode.

However, according to another embodiment of the present invention, the second, fourth and sixth control voltages VPP2, VPP4 and VPP6 are equal to the supply voltage VCC. In this case, a time required for boosting the second, fourth and sixth control voltages VPP2, VPP4 and VPP6 to the first, third and fifth control voltages VPP1, VPP3 and VPP5 when the control signal WEN is activated is longer than in the above embodiment. However, if the control signal WEN is deactivated, the write boosting circuit PUMPW, the column boosting circuit PUMPC and the row boosting circuit PUMPR can output the supply voltage VCC without outputting the second, fourth and sixth control voltages VPP2, VPP4 and VPP6.

In the write operation mode, the phase change memory device 400 drives the write driver WD, the column decoder YD and the row decoder XD using a high level voltage, and in the read operation mode and the standby mode, drives the write driver WD, the column decoder YD and the row decoder XD using a voltage lower than in the write operation mode, thereby reducing current consumption in the write operation mode and enhancing operational reliability.

The term "sub control voltages" used in the claims relating to the phase change memory device, corresponds to the second, fourth and sixth control voltages VPP2, VPP4 and VPP6 described above, and the term "control node" used in the claims corresponds to the node N4.

In embodiments of the present invention, each phase change memory cell includes phase change material including germanium (Ge), antimony (Sb), and tellurium (Te). However, the invention can also be applied to a memory device including an arbitrary material whose state changes according to an applied current or voltage.

As described above, in a phase change memory device and a driving method thereof according to embodiments of the present invention, by applying a sufficient a first drive voltage or voltages to a write driver, a column decoder and a row decoder in a write operation mode, and by applying a lower second drive voltage or voltages to the write driver, the column decoder and the row decoder in a read operation mode and standby operational mode, it is possible to reduce current loss and enhance operation reliability. Also, by maintaining word lines and bit lines at the same voltage in the standby mode, leakage current can be minimized.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A phase change memory device, comprising:
a memory array comprising a plurality of phase change memory cells, a plurality of bit lines, and a plurality of word lines, wherein each phase change memory cell comprises a phase change element and a diode connected in series between a bit line and a word line;
a control node;
a plurality of column selection transistors which selectively connect respective bit lines to a data line; and
a least one boosting circuit which receives a first voltage and outputs at least one control voltage which is greater than the first voltage;
wherein, in a write operation mode, the phase change memory device is adapted to apply at least one control voltage from the at least one boosting circuit to the control node and respective gates of the column selection transistors; and
wherein, in a standby mode, the phase change memory device is adapted to maintain the word lines and the bit lines at a same voltage, to apply a ground voltage to the gates of the column selection transistors, and to precharge the control node to the first voltage.

2. The phase change memory device of claim 1, wherein, in a operation mode, the memory device is adapted to apply the first voltage to the gates of the column selection transistors, to apply a ground voltage to a selected word line of the selected phase change memory cell, and to apply a clamping voltage to the control node.

3. The phase change memory device of claim 1, wherein, in the standby mode, the memory device is adapted to maintain the word lines and the bit lines at the first voltage.

4. The phase change memory device of claim 1, wherein, in the standby mode, the memory device is adapted to maintain the word lines and the bit lines at a ground voltage.

5. The phase change memory device of claim 1, wherein, in the standby mode, the memory device is adapted to maintain the word lines and the bit lines in a floating voltage state.

6. The phase change memory device of claim 1, wherein, in the write operation mode and a read operation mode, the memory device is adapted to activate a word line and a bit line connected to a selected phase change memory cell, and to maintain the bit lines connected to non-selected phase change memory cells in a floating voltage state.

7. The phase change memory device of claim 1, wherein, in the write operation mode and a read operation mode, the memory device is adapted to activate a word line and a bit line connected to a selected phase change memory cell, and to maintain remaining bit lines connected to non-selected phase change memory cells at a predetermined clamping voltage.

8. The phase change memory device of claim 1, further comprising:

a write driver which receives a first control voltage from the at least one boosting circuit, and which controls the control node to write data to the phase change memory cells;

a column decoder which receives the first voltage and a second control voltage from the at least one boosting circuit, and which controls the column selection transistors; and a row decoder which receives the first voltage and a third control voltage from the at least one boosting circuit, and which controls the word lines of the memory array.

9. The phase change memory device of claim 8, wherein the at least one boosting circuit comprises first, second and third boosting circuits which output the first, second and third control voltages, respectively;

wherein the memory device further comprises a first selection circuit which selectively applies the first voltage or the second control voltage to the column decoder, and a second selection circuit which selectively applies the first voltage or the third control voltage to the row decoder.

10. The phase change memory device of claim 9, wherein the boosting circuits boosts the first voltage to generate sub control voltages in the read operation mode and the standby mode, and wherein the sub control voltages are lower than the control voltages and higher than the first voltage.

11. The phase change memory device of claim 10, wherein the control signal is a write enable signal activated in the write operation mode, and deactivated in the read operation mode and standby mode.

12. A phase change memory device comprising:

a memory array comprising a plurality of phase change memory cells, a plurality of bit lines, and a plurality of word lines, wherein each phase change memory cell comprises a phase change element and a diode connected in series between a bit line and a word line;

a write driver which writes data to one of the phase change memory cells of the memory array;

a column decoder which selects a bit line of the phase change memory cell to which the data is written;

a row decoder which selects a word line of the phase change memory cell to which the data is written;

a plurality of separate voltage generators which respectively supply drive voltages to the write driver, the column decoder, and the row decoder, wherein the voltage generators generate control voltages obtained by boosting a first voltage in a write operation mode, and generate sub control voltages lower than the control voltages and higher than the first voltage in a read operation mode and a standby mode;

first and second selectors, respectively corresponding to the column decoder and the row decoder, which select one of the control voltages and the first voltage in response to a control signal, and applying the selected voltage to the respective column decoder and the row decoder;

wherein the memory device is adapted in a standby mode to maintain the word lines and the bits lines at a same voltage.

13. The phase change memory device of claim 12, wherein the control signal is a write enable signal activated in the write operation mode and deactivated in the read operation mode and the standby mode.

14. The phase change memory device of claim 12, wherein, in the standby mode, the memory device is adapted to maintain a voltage of the word lines and the bit lines at the first voltage or a ground voltage.

15. The phase change memory device of claim 12, wherein, in the standby mode, the memory device is adapted to maintain the word lines and the bit lines connected in a floating voltage state.

16. The phase change memory device of claim 12, wherein, in the write operation mode and the read operation mode, the memory device is adapted to activate a word line and a bit line connected to the selected phase change memory cell, and to maintain bit lines connected to non-selected phase change memory cells in a floating voltage state.

17. The phase change memory device of claim 12, wherein, in the write operation mode and the read operation mode, the memory device is adapted to activate a word line and a bit line connected to the selected phase change memory cell, and to maintain bit lines connected to non-selected phase change memory cells at a predetermined clamping voltage.

18. A phase change memory device, comprising:

a memory array comprising a plurality of phase change memory cells, a plurality of bit lines, and a plurality of word lines, wherein each phase change memory cell comprises a phase change element and a diode connected in series between a bit line and a word line;

a control node;

a plurality of column selection transistors which selectively connect respective bit lines to a data line; and a least one boosting circuit which receives a first voltage and outputs at least one control voltage which is greater than the first voltage;

a write driver which receives a first control voltage from at least one boosting circuit, and which controls the control node to write data to the phase change memory cells;

a column decoder which receives the fist voltage and a second control voltage from the at least one boosting circuit, and which controls the column selection transistors; and a row decoder which receives the first voltage and a third control voltage from the at least one boosting circuit, and which controls the word lines of the memory array, wherein, in a write operation mode, the phase change memory device is adapted to apply at least one control voltage from the at least one boosting circuit to the control node and respective gates of the column selection transistors; and wherein in a standby mode, the phase change memory device is adapted to maintain the word lines and the bit lines at a same voltage.

* * * * *